United States Patent [19]

Tanaka et al.

[11] Patent Number: 5,007,024
[45] Date of Patent: Apr. 9, 1991

[54] SEMICONDUCTOR MEMORY DEVICE WITH SENSE AMPLIFIER CONTROLLER

[75] Inventors: Yutaka Tanaka, Yokohama; Masanori Haraguchi, Ayase, both of Japan

[73] Assignee: Kabushiki Kaisha Toshiba, Kanagawa, Japan

[21] Appl. No.: 466,920

[22] Filed: Jan. 18, 1990

[30] Foreign Application Priority Data

Jan. 31, 1989 [JP] Japan .................. 1-21004

[51] Int. Cl.[5] .................. G11C 7/00; G11C 11/407
[52] U.S. Cl. ..................... 365/207; 365/210; 365/203; 365/189.08
[58] Field of Search ............ 365/203, 205, 207, 208, 365/210, 189.08, 189.04, 196, 227; 307/530

[56] References Cited

U.S. PATENT DOCUMENTS

| | | | |
|---|---|---|---|
| 4,792,928 | 12/1988 | Tobita | 365/207 |
| 4,802,138 | 1/1989 | Shimamune | 365/200 |
| 4,831,591 | 5/1989 | Imazeki et al. | 365/210 X |
| 4,926,382 | 5/1990 | Sakui et al. | 365/203 |

Primary Examiner—Alyssa H. Bowler
Attorney, Agent, or Firm—Banner, Birch, McKie & Beckett

[57] ABSTRACT

In a semiconductor memory device having a sense amplifier for amplifying a potential difference between a pair of regular bit lines, the memory device further comprises a dummy bit line having a load capacitance equal to that of each of the pair of regular bit lines, a dummy memory cell having a bit line drive capability equal to that of the regular memory cell, a precharging circuit for precharging the dummy bit line, a selecting circuit for simultaneously selecting the regular memory cell and the dummy memory cell, a dummy bit line potential sensing circuit for sensing that the potential of the dummy bit line is changed from a precharge potential by a predetrmined potential when the dummy memory cell is selected by the selecting circuit, and a sense amplifier control circuit for receiving an enable signal which enables operation of the sense amplifier, and a sensed signal from the dummy bit line potential sensing circuit, to determine an operation period of the sense amplifier, in response to both the enable and the sensed signals. When the output data is determined by the sense amplifer, an output logic level of the level sensor is inverted, and the sense amplifier is disabled. The sense amplifier is kept disabled until the next clock signal is generated, and no feedthrough current flows during this period, decreasing wasteful power current consumption.

7 Claims, 5 Drawing Sheets

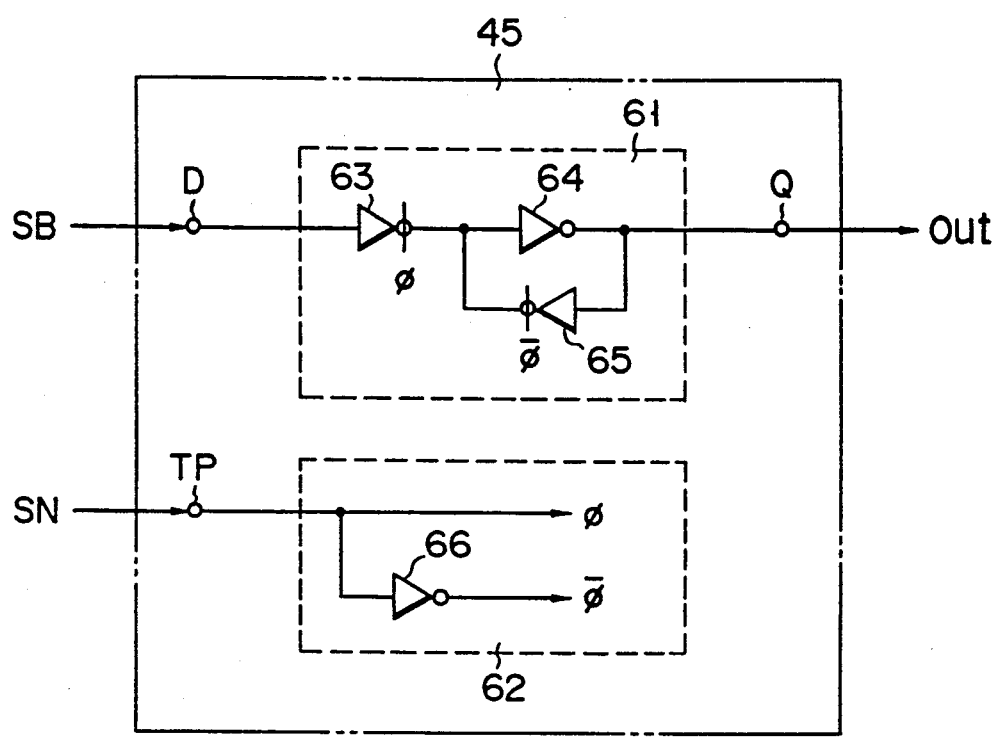
F I G. 5

SEMICONDUCTOR MEMORY DEVICE WITH SENSE AMPLIFIER CONTROLLER

BACKGROUND OF THE INVENTION

1. Field of the Invention

The present invention relates to a semiconductor memory device in which a pair of bit lines are precharged prior to data read access, and, in a data read mode, a potential difference between the pair of bit lines is amplified by a sense amplifier, in order to sense the data.

2. Description of the Related Art

In a conventional synchronous semiconductor memory device, a synchronous clock signal is used as an enable signal for a sense amplifier for sensing data.

FIG. 1 is a circuit diagram of a data read system circuit of a memory cell contained in a conventional synchronous semiconductor memory device.

Memory cell 14 includes a latch circuit 15, and n-channel MOS transistors 16 and 17 which serve as transfer gates and are inserted between the latch circuit 15 and a pair of bit lines 11 and $\overline{11}$, respectively. The gates of the transistors 16 and 17 are connected to the word line 12 which, along with precharge line 13, is intersected by bit lines 11 and $\overline{11}$.

A precharge circuit section 18 includes p-channel MOS transistors 19 and 20, one terminal of each of which is connected to the corresponding one of the pair of bit lines 11 and $\overline{11}$, the other terminal of each being connected to a power source voltage Vcc, and a p-channel MOS transistor 21 connected between the bit lines 11 and 11. Gates of the transistors 19, 20, and 21 are connected to the precharge line 13.

A potential difference between the bit lines 11 and $\overline{11}$ is input across the gates of n-channel MOS transistors 23 and 24, to which the bit lines are connected, respectively. P-channel MOS transistors 25 and 26 are inserted between the power source voltage Vcc and one terminal of the transistor 23 and between the power source voltage Vcc and one terminal of the transistor 24, respectively. The gates of transistors 25 and 26 are connected to each other, and are commonly connected to a connecting node SA located between the transistors 25 and 23. An n-MOS transistor 27 having a gate for receiving an enable signal for differential type sense amplifier 22 is inserted between the other terminal of each of the transistors 23 and 24, and a ground voltage Vss. A sensing result of the sense amplifier 22 is obtained at a connecting node SB located between the transistors 24 and 26, and is output as an output Out through two inverters 28 and 29.

Reference numeral 30 denotes a read control circuit including inverters 31, 32, and 34, and a NAND gate 33. A synchronous clock signal CK having a constant frequency is supplied to the inverters 31 and 32 located in separate signal paths, and is inverted by the inverters 31 and 32. The signal inverted by the inverter 31 is supplied as a precharge signal $\overline{PR}$ to the precharge line 13. The signal inverted by the inverter 32 is supplied to one input terminal of the 2-input NAND gate 33, the other input terminal of the gate 33 receiving a read/write signal RW. An output from the NAND gate 33 is supplied in the form of a read control signal RD via the inverter 34, to the gate of the transistor 27 contained in the sense amplifier 22.

FIG. 2 is a timing chart showing waveforms of sections within the circuit shown in FIG. 3, when in the read mode, the read/write signal RW being set at "H" level in this mode. A read operation performed by the circuit shown in FIG. 3 will now be described hereinafter, with reference to the above-mentioned timing chart.

When the signal CK goes to "H" level, the precharge signal $\overline{PR}$ goes to "L" level. As a result, the transistors 19, 20, and 21 in the precharge circuit 18 are turned on, and the bit lines 11 and $\overline{11}$ are precharged at "H" level.

When the clock signal CK goes to "L" level from "H" level, the precharge signal PR goes to "H" level, and the precharge operation in respect of the bit lines 11 and $\overline{11}$ is completed. When the signal CK goes to "L" level from "H" level, the signal RD goes to "H" level from "L" level, and the transistor 27 is turned on, as a result of which the sense amplifier 22 is enabled.

The word line 12 is selected by a decoder (not shown), and a signal WD goes from "L" level to "H" level, with the result that the transistors 16 and 17 in the memory cell 14 are turned on, and memory data "1" or "0" in the latch circuit 15 is read out on the bit lines 11 and $\overline{11}$. Bit line potentials BT and $\overline{BT}$ are set in accordance with the readout data. If the potential BT is set at "H" level and the potential $\overline{BT}$ is set at "L" level, the potential $\overline{BT}$ is reduced with time. When a predetermined period of time has elapsed and the difference between the potentials BT and $\overline{BT}$ is set to be $\Delta V$ or more, the logic level of the node SB in the sense amplifier 22 becomes "H", and this "H"-level signal is output as the output Out through the inverters 28 and 29.

If the potential BT is set at "L" level and the potential $\overline{BT}$ is set at "H" level, the potential BT is reduced with time. As a result, the logic level of the node SB becomes "L"; hence the output Out serves as an "L"-level signal.

When the clock signal CK again goes to "H" level, a precharge operation in respect of the bit lines 11 and $\overline{11}$ is started by the precharge circuit 18. On the other hand, the signal RD goes to "L" level, and the sense amplifier 22 is disabled.

The above-mentioned conventional memory device has a problem, however, in that current consumption in the read mode is high, due to a feedthrough current being flown over an extended period of time.

More specifically, the operation period of the sense amplifier 22 depends on the level of the signal RD, and for this reason, the sense amplifier 22 is kept enabled during a period $\underline{t}$ wherein the signal RD is set at "H" level. In other words, the sense amplifier 22 is not disabled until the clock signal CK goes to "H" level after the logic level of the node SB is determined. Assume that the potential BT is set at "H" level and the potential $\overline{BT}$ is set at "L" level, in accordance with memory data of the memory cell 14. In this case, the transistor 23 is turned on, and the potential of the node SA is reduced. Thereafter, when the potential of the node SA exceeds an absolute value of the threshold voltage of the transistor 25, the transistor 25 is turned on. As a result, a feedthrough current is generated which passes through the transistors 25, 23, and 27, and flows during the time $\underline{t}$ after the logic level of the node SB is determined. As a result, current consumption in the read mode is high.

Thus, as described above, the conventional device has a problem in that its current consumption is high, due to the length of time the feedthrough current is supplied to the sense amplifier.

SUMMARY OF THE INVENTION

The present invention has been developed in light of the above situation, and has as its object to provide a semiconductor memory device in which the feedthrough current supplied to a sense amplifier in a read mode is reduced, thereby to achieve a reduction in the amount of current consumed by the system of which the memory device is a part.

According to the present invention, there is provided a semiconductor memory device comprising a memory cell, a pair of bit lines connected to the memory cell, a first precharging means, for precharging the pair of bit lines, a sense amplifier for amplifying a potential difference between the pair of bit lines, a dummy bit line having a load capacitance equal to that of each of the pair of bit lines, a dummy memory cell having a bit line drive capability equal to that of the memory cell, a second precharging means, for precharging the dummy bit line, a selecting means for simultaneously selecting the memory cell and the dummy memory cell, a dummy bit line potential sensing means, for sensing that the potential of the dummy bit line is changed from a precharge potential by a predetermined potential when the dummy memory cell is selected by the selecting means, and a sense amplifier control means for receiving an enable signal which enables operation of the sense amplifier, and a sensed signal from the dummy bit line potential sensing means, to determine an operation period of the sense amplifier, in response to both the enable and the sensed signals.

The operation of the above-mentioned memory device is as follows.

In a data read mode, the potential of each of the pair of bit lines is changed in accordance with the data contained in the memory cell. The sense amplifier can determine the data read out from the memory cell when the potential difference between the pair of bit lines is sufficiently large. A potential of the dummy bit line is reduced in accordance with reduction of potential of the "L" level bit line. When a predetermined time period has elapsed, the potential of the "L" level bit line is reduced by a predetermined potential. When the output data is determined by the sense amplifier, an output logic level of the level sensor is inverted, and the sense amplifier is disabled. In other words, the sense amplifier is kept disabled until the next clock signal is generated after readout output data is determined. Therefore, a feedthrough current which flows during this period in the conventional device does not flow in this device, and current consumption can be extremely decreased.

BRIEF DESCRIPTION OF THE DRAWINGS

FIG. 5 is a circuit diagram of a data latch circuit 45 incorporated in the circuit shown in FIG. 3.

DETAILED DESCRIPTION OF THE PREFERRED EMBODIMENT

An embodiment of the present invention will be described hereinafter, with reference to the accompanying drawings.

Figure 1:
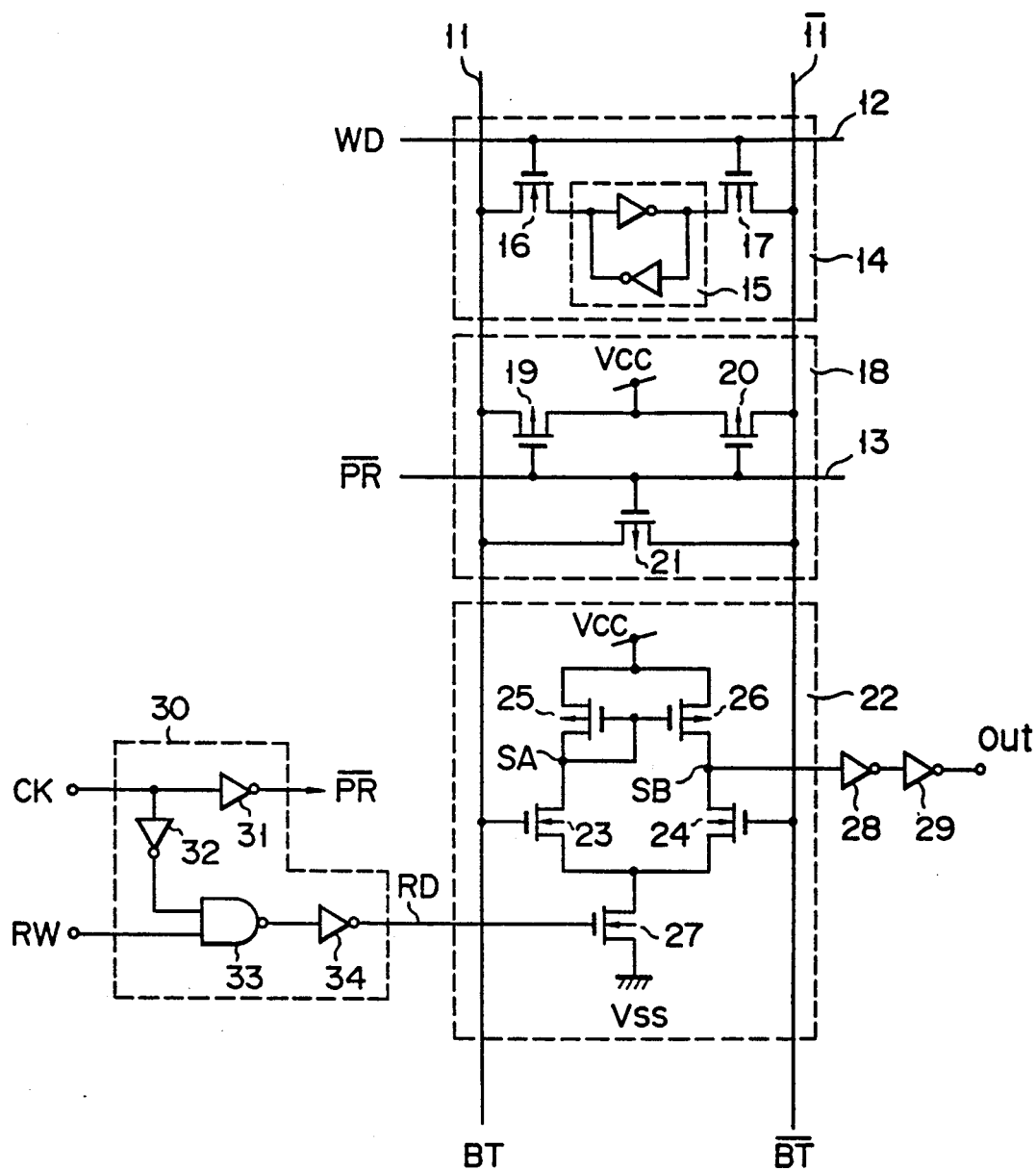
FIG. 1 is a circuit diagram showing a memory cell and its peripheral circuits, contained in a conventional semiconductor device.
Figure 2:
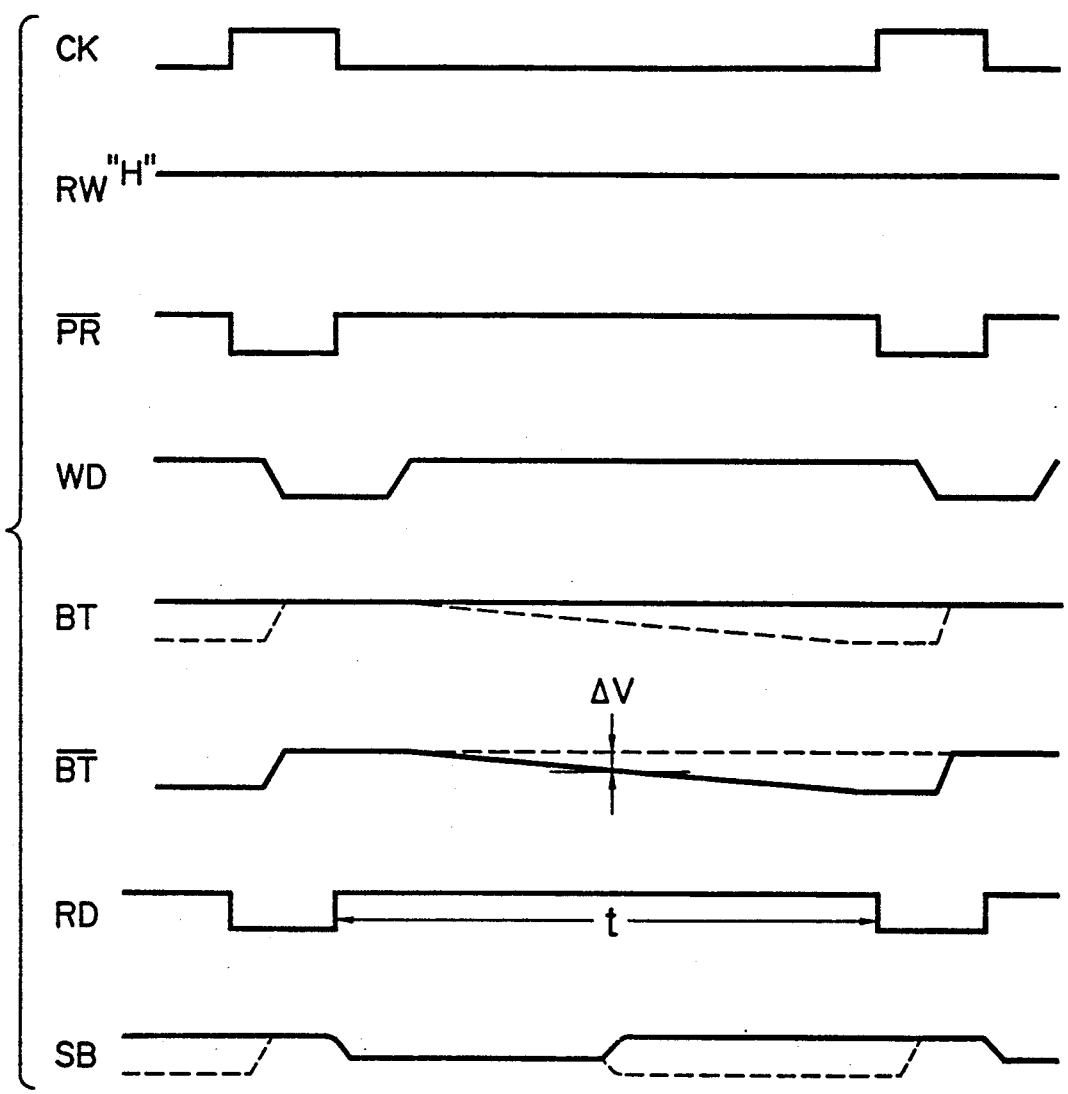
FIG. 2 is a timing chart of signals of circuit components shown in FIG. 1, when the system is in a data read mode.
Figure 3:
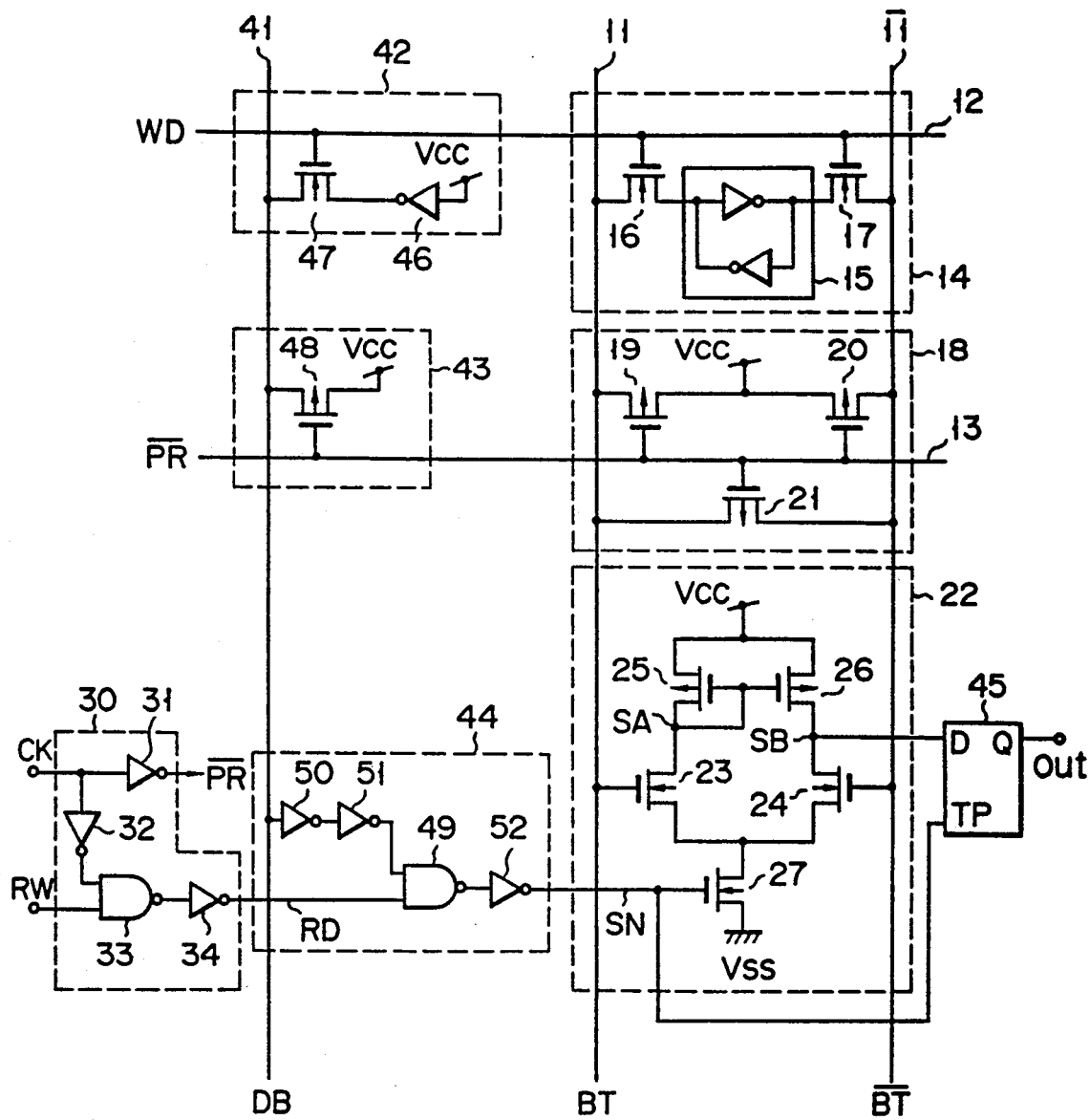
FIG. 3 is a circuit diagram showing a memory cell and its peripheral circuits, contained in a semiconductor device according to an embodiment of the present invention.

FIG. 3 is a circuit diagram of a data read system circuit of a memory cell contained in a semiconductor memory device according to the present invention, and shows a memory cell 14, a precharge circuit 18, a differential type sense amplifier 22, and a read control circuit 30, which are arranged in the same manner as in the conventional device shown in FIG. 1.

More specifically, the memory cell 14 includes a latch circuit 15 and n-channel MOS transistors 16 and 17, which serve as transfer gates and are inserted between the latch circuit 15 and the pair of bit lines 11 and $\overline{11}$. respectively. The gates of the transistors 16 and 17 are connected to the word line 12 which, along with precharge line 13, is intersected by bit lines 11 and $\overline{11}$.

The precharge circuit 18 includes p-channel MOS transistors 19 and 20, one terminal of each of which is connected to the corresponding one of the pair of bit lines 11 and $\overline{11}$, the other terminal of each being connected to a power source voltage Vcc, and a p-channel MOS transistor 21 connected between the bit lines 11 and $\overline{11}$. The gates of the transistors 19, 20, and 21 are connected to the precharge line 13.

A potential difference between the bit lines 11 and $\overline{11}$ is input across the gates of n-channel MOS transistors 23 and 24, to which the bit lines are connected, respectively. P-channel MOS transistors 25 and 26 are inserted between the power source voltage Vcc and one terminal of the transistor 23 and between the power source voltage Vcc and one terminal of the transistor 24, respectively. The gates of the transistors 25 and 26 are connected to each other, and are commonly connected to a connecting node SA located between the transistors 25 and 23. An n-channel MOS transistor 27 having a gate for receiving an enable signal for the sense amplifier 22 is inserted between the other terminal of each of the transistors 23 and 24, and a ground voltage Vss. A sensing result of the sense amplifier 22 is obtained at a connecting node SB located between the transistors 24 and 26.

Read control circuit 30 includes inverters 31, 32, and 34, and a NAND gate 33. A synchronous clock signal CK having a constant frequency is supplied to the inverters 31 and 32 in separate signal paths, and is inverted by the inverters 31 and 32. The signal inverted by the inverter 31 is supplied as a precharge signal $\overline{PR}$ to the precharge line 13. The signal inverted by the inverter 32 is supplied to one input terminal of the 2-input NAND gate 33, the other input terminal of the gate 33 receiving a read/write signal RW. An output from the NAND gate 33 is output through the inverter 34, as a read control signal RD.

This embodiment additionally includes a dummy bit line 41, a dummy memory cell 42, a precharge circuit 43, a level sensor 44, and a latch circuit 45.

The dummy bit line 41 is made of the same wiring material as that of the bit lines 11 and $\overline{11}$, and is equal in length to bit lines 11 and $\overline{11}$. As a result, bit line 41 has a load capacity equal to that of these bit lines.

The dummy cell 42 includes an inverter 46, the input terminal of which is connected to the power source voltage Vcc, and an n-channel MOS transistor 47 which is inserted between the output terminal of the inverter 46 and the dummy bit line 41, and the gate of which is connected to the word line 12. The dummy cell 42 has a bit line drive capability equal to that of the memory cell 14.

The precharge circuit 43 is inserted between the power source voltage Vcc and the dummy bit line 41, and includes a p-channel MOS transistor 48, the gate of which is connected to the precharge line 13.

The level sensor 44 includes a NAND gate 49 and inverters 50, 51, and 52. More specifically, the output signal RD from the read control circuit 30 is supplied to one input terminal of the NAND gate 49. The inverters 50 and 51 are serially inserted between the dummy bit line 41 and the other input terminal of the NAND gate 49. An output from the NAND gate 49 is supplied to the inverter 52, and an output SN (i.e., an output from the level sensor 44) from the inverter 52 is supplied to the gate of the transistor 27 in the sense amplifier 22.

The node SB in the sense amplifier 22 is connected to an input terminal D of the latch circuit 45, the latch control terminal TP of which receives the output signal SN from the level sensor 44. The latch circuit 45 additionally has an output terminal Q through which an output Out from the memory device is output.

Figure 4:
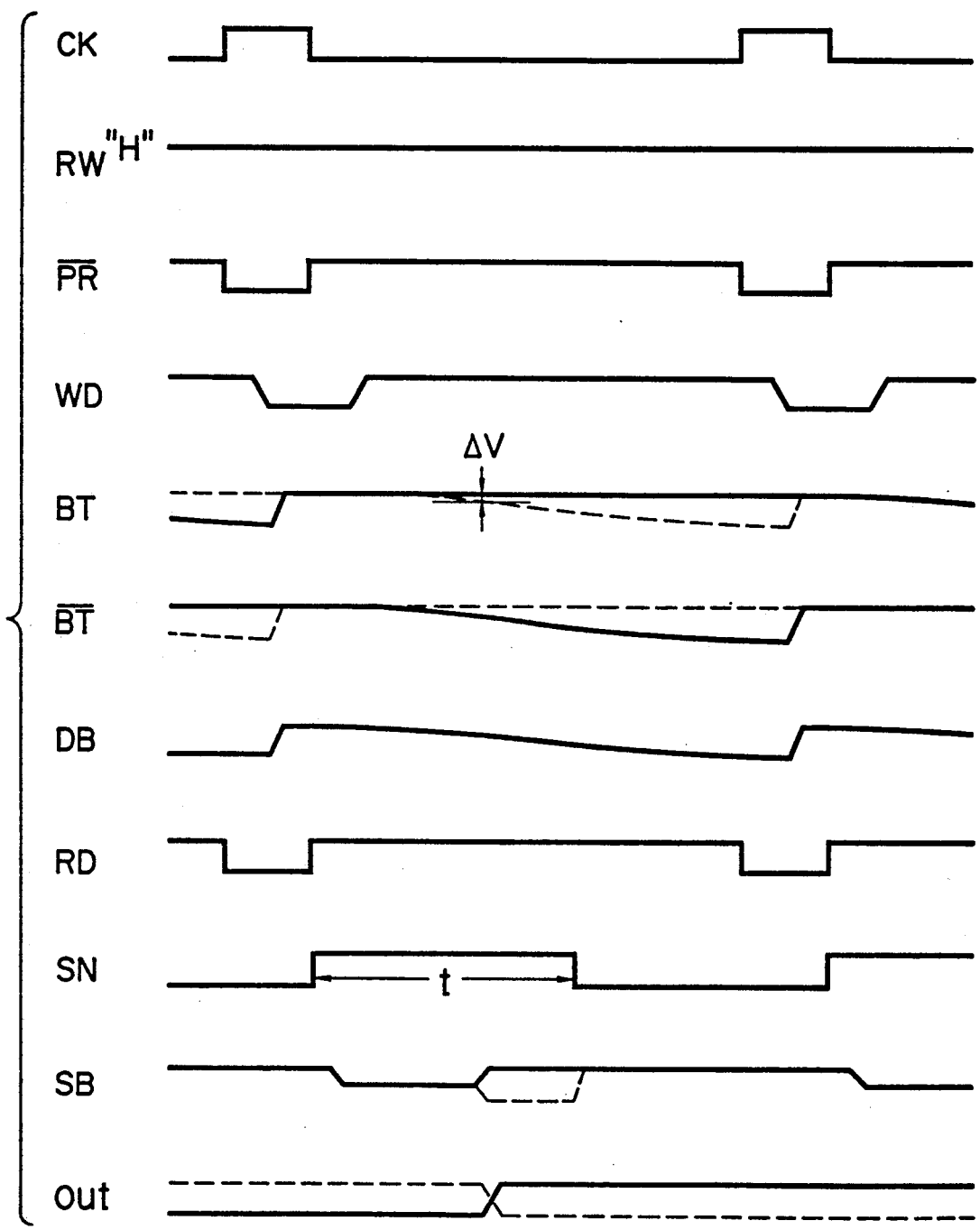
FIG. 4 is a timing chart of signals of circuit components shown in FIG. 3, when the system is in a data read mode.

FIG. 4 is a timing chart showing waveforms of circuit components shown in FIG. 3, when the circuit of FIG. 3 is in a read mode. The read/write signal RW is set at "H" level, when the circuit is in the read mode. A data read operation will be described hereinafter with reference to this timing chart.

When the clock signal CK goes to "H" level, the precharge signal $\overline{PR}$ goes to "L" level. As a result, the transistors 19, 20, and 21 in the precharge circuit 18 are turned on, and the bit lines 11 and $\overline{11}$ are precharged at "H" level. In addition, the transistor 48 in the precharge circuit 43 is turned on, with the result that the dummy bit line 41 is precharged to "H" level. In short, bit line potentials BT, $\overline{BT}$, and DB are all set at "H" level.

The setting of the clock signal CK at "H" level also results in the signal RD from the read control circuit 30 being set at "L" level; hence the output signal SN from the level sensor 44 is also set at "L" level. This causes the transistor 27 in the sense amplifier 22 to be turned off, and the sense amplifier 22 to be disabled.

When, on the other hand, the clock signal CK goes from "H" level to "L" level, the precharge signal $\overline{PR}$ goes to "H" level, and a precharge operation for the bit lines 11 and $\overline{11}$ and for the dummy bit lines 41 is ended. In addition, the signal RD goes from "L" level to "H" level, and thus two inputs to the NAND gate 49 in the level sensor 44 go to "H" level. Hence, the signal SN goes from "L" level to "H" level, as a result of which the transistor 27 is turned on and the sense amplifier 22 is enabled.

The word line 12 is selected by a decoder (not shown), and a signal WD for activating the word line 12 goes from "L" level to "H" level. As a result, the transistors 16 and 17 in the memory cell 14 are turned on, so that memory data "1" or "0" in the latch circuit 15 is read out onto the bit lines 11 and $\overline{11}$, and bit line potentials BT and $\overline{BT}$ are set in accordance with the memory data. In addition, the transistor 47 in the dummy cell 42 is turned on, and the "L" level signal is output onto the dummy bit line 41.

If the potential BT is set at "H" level and the potential $\overline{BT}$ at "L" level, the potential $\overline{BT}$ is reduced with time. When a predetermined period of time has elapsed and the potential difference between the bit line potentials BT and $\overline{BT}$ is larger to be $\Delta V$ or more, the logic level of the node SB in the sense amplifier 22 is set at "H" level. During the period in which the signal SN is set at "H" level, the latch circuit 45 latches the "H"-level signal, i.e., data sensed by the sense amplifier.

The dummy bit line potential DB is reduced in correspondence with reduction in bit line potential BT. After a predetermined period of time has elapsed, the potential DB is lowered from a precharge potential by the threshold voltage of the inverter 50, so that the output of the inverter 50 is inverted to "H" level. As a result, the output signal SN of the level sensor 44 is inverted to "L" level, whereby the transistor 27 in the sense amplifier 22 is turned off, and the sense amplifier 22 is disabled. Consequently, until the clock signal CK again goes to "H" level, the operation of the sense amplifier 22 is inhibited. As a result, a current consumption after the determination of the data sensed by the sense amplifier, due to a feedthrough current in the sense amplifier, can be reduced.

When the potential BT is set at "L" level and the potential $\overline{BT}$ is set at "H" level, the potential BT is reduced with time. As a result, the logic level of the node SB goes to "L" level, and hence the level of the output Out goes to "L" level.

FIG. 5 is a circuit diagram showing an arrangement of the data latch circuit 45 as incorporated in the circuit shown in FIG. 3.

The latch circuit 45 includes a latch section 61 and a control signal generator section 62.

The latch section 61 includes inverters 63, 64, and 65. The inverters 63 and 65 are controlled in response to control signals $\phi$ and $\overline{\phi}$, respectively, and the inverters 64 and 65 constitute a flip-flop circuit. The input terminal of the inverter 63 serves as a terminal D of the latch circuit 45, and receives the signal SB. A signal SB received is level-inverted by the inverter 63, and further level-inverted by the inverter 64. The resulting inverted signal is output as an output signal Out from a terminal Q. The output from the inverter 64 is also input to its input terminal through the inverter 65.

The control signal generator section 62 generates the control signals $\phi$ and $\overline{\phi}$ in response to the signal SN. The input terminal of the control signal generator section 62 forms as a terminal TP of the latch circuit. The input signal SN is output as the non-inverted control signal $\phi$, and is also output through an inverter 66 as the control signal $\overline{\phi}$. The control signals $\phi$ and $\overline{\phi}$ are respectively input to the inverters 63 and 65, to control their gates.

When the signal SN is set at "H" level, the control signal $\phi$ at "H" level, and the control signal $\overline{\phi}$ at "L" level. As a result, the gate of the inverter 63 in the latch section 61 is opened, the gate of the inverter 65 is closed, and hence the signal SB is latched by the latch section 61.

On the other hand, when the signal SN is set at "L" level, the control signal $\phi$ is set at "L" level and the control signal $\overline{\phi}$ is set at "H" level. As a result, the gate of the inverter 63 in the latch section 61 is closed, and the gate of the inverter 65 is opened. Consequently, the signal SB is not input to the latch section 61, and thus is not latched.

According to the above embodiment, after data is determined by the sense amplifier, the sense amplifier is disabled, reducing a feedthrough current. Therefore, wasteful current consumption can be decreased.

In addition, the read operation can be performed at high speed substantially the same as that in the conventional device.

The dummy bit line and its peripheral circuits are suitable for design of a variable memory capacity type RAM required in an ASIC (IC for specific application-application specific integrated circuit). This is because, even if a RAM having an arbitrary size is designed, a timing at which the sense amplifier is disabled is automatically changed depending on a load capacity of bit line.

As has been described above, according to the present invention, there is provided a semiconductor memory device for reducing a feedthrough current supplied to the sense amplifier, thus reducing current consumption of the memory system.

What is claimed is:

1. A semiconductor memory device comprising:
   a memory cell;
   a pair of bit lines connected to said memory cell;
   first precharging means, for precharging said pair of bit lines;
   a sense amplifier for amplifying a potential difference between said pair of bit lines;
   a dummy bit line having a load capacity equal to that of each of said pair of bit lines;
   a dummy memory cell having a bit line drive capability equal to that of said memory cell;
   second precharging means, for precharging said dummy bit line;
   selecting means for simultaneously selecting said memory cell and said dummy memory cell;
   dummy bit line potential sensing means for sensing that the potential of said dummy bit line is changed from a precharge potential by a predetermined potential when said dummy memory cell is selected by said selecting means; and
   sense amplifier control means for receiving an enable signal which enables an operation of said sense amplifier, and a sensed signal from said dummy bit line potential sensing means to determine an operation period of said sense amplifier, in response to both the enable and the sensed signals.

2. A device according to claim 1, further comprising latch means, controlled in response to an output from said sense amplifier control means, for latching an output from said sense amplifier.

3. A device according to claim 2, wherein said latching means comprises a control signal generator section for receiving an output signal from said sense amplifier control means, to output first and second complimentary level control signals, and a latch section for latching the output signal from said sense amplifier in response to the control signal from said control signal generator section.

4. A device according to claim 3, wherein said latch section comprises an inverter, controlled in response to the first control signal, for inverting a level of the output signal from said sense amplifier, and a flip-flop circuit, controlled in response to the second control signal, for latching the output signal from said inverter.

5. A device according to claim 3, wherein said flip-flop circuit comprises a first inverter, for inverting a level of an output signal from said inverter in said latching means, to output the inverted signal as an output signal from said latching means, and a second inverter, controlled in response to the second control signal, for inverting a level of an output signal from said first inverter, to output the inverted signal to an input section of said first inverter.

6. A device according to claim 1, wherein said dummy bit line potential sensing means comprises an inverter, connected to said dummy bit line, for inverting an output level of said sensing means when a potential of said dummy bit line exceeds a threshold voltage thereof.

7. A device according to claim 6, wherein said sense amplifier control means comprises a first inverter, for inverting a level of an output signal from said inverter in said dummy bit line potential sensing means, a NAND gate for obtaining a negative AND logic of the output signal from said inverter and the enable signal, and a second inverter, for inverting a level of the output signal from said NAND gate.

* * * * *